(12) United States Patent
Ouchi

(10) Patent No.: US 8,143,947 B2
(45) Date of Patent: Mar. 27, 2012

(54) SEMICONDUCTOR DIFFERENTIAL AMPLIFIER

(75) Inventor: Shinichi Ouchi, Tsukuba (JP)

(73) Assignee: National Institute of Advanced Industrial Science and Technology (JP)

( * ) Notice: Subject to any disclaimer, the term of this patent is extended or adjusted under 35 U.S.C. 154(b) by 0 days.

(21) Appl. No.: 12/920,334

(22) PCT Filed: Mar. 3, 2009

(86) PCT No.: PCT/JP2009/053942
§ 371 (c)(1),
(2), (4) Date: Aug. 31, 2010

(87) PCT Pub. No.: WO2009/110455
PCT Pub. Date: Sep. 11, 2009

(65) Prior Publication Data
US 2011/0001561 A1 Jan. 6, 2011

(30) Foreign Application Priority Data
Mar. 6, 2008 (JP) ................................ 2008-055995

(51) Int. Cl.
*H03F 3/45* (2006.01)
(52) U.S. Cl. ...................................... 330/253; 330/258
(58) Field of Classification Search .................. 330/253, 330/258; 327/534
See application file for complete search history.

(56) References Cited

U.S. PATENT DOCUMENTS

| 6,281,753 | B1 | 8/2001 | Corsi et al. |
| 6,346,858 | B1 * | 2/2002 | Forbes ........................... 330/253 |
| 7,391,262 | B2 * | 6/2008 | Zhang ............................ 330/253 |
| 2004/0195610 | A1 | 10/2004 | Morikado |
| 2007/0247227 | A1 | 10/2007 | Zhang |
| 2009/0015329 | A1 * | 1/2009 | Chatterjee et al. ............ 330/253 |

FOREIGN PATENT DOCUMENTS
JP 2007-251507 9/2007

OTHER PUBLICATIONS

Shouri Chatterjee, "0.5-V Anatog Circuit Techniques and Their Application in OTA and Filter Design", IEEE Journal of Solid-State Circuits, vol. 40, No. 12, Dec. 2005, pp. 2373-2387.

* cited by examiner

*Primary Examiner* — Khanh Nguyen
(74) *Attorney, Agent, or Firm* — Bacon and Thomas PLLC

(57) ABSTRACT

There is provided a circuit to make a bias for adjusting a threshold voltage of MOS devices available in a wide range, to extend the amplitude range of the input voltage range of a semiconductor differential amplifier from a power supply potential to a ground potential, and automatically to ensure an operation of a differential pair in the saturation region as rejecting the common-mode signal in the entire voltage range. The semiconductor differential amplifier is configured by the first gates of two four-terminal fin type FETs serving as an input terminal of differential pair, and in that the second gates of the four-terminal fin type FETs interconnected with each other, wherein a signal decreasing monotonously along with the increase in the input common-mode component is input.

2 Claims, 5 Drawing Sheets

SEMICONDUCTOR DIFFERENTIAL AMPLIFIER

TECHNICAL FIELD

The present invention relates to a semiconductor differential amplifier.

BACKGROUND ART

Semiconductor amplifiers are widely used for amplification of analog signals. In particular, a semiconductor differential amplifier is basically configured by a differential pair 102 including a current source 101 as shown in FIG. 1.

Due to development of the CMOS (Complementary Metal Oxide-Semiconductor) integrated circuit technology, both digital circuits and analog circuits become to be integrated on the same substrate as used for the CMOS integrated circuit. Integration of various types of circuits on a single substrate enables miniaturization of the system and reduction in cost of the products.

Such a development in integrated circuits has been achieved by size reduction of devices. The size reduction of devices leads to improvement of the circuit performance, especially of the digital circuit which is a main part of the integrated circuit. In other words, an operation speed is improved, power consumption is reduced, and a device area is decreased. A benefit to the analog circuits due to the size reduction of devices is an increase in the cut off frequency.

However, constraints on the design of an analog circuit also increase at the same time. One of them is a reduction in the input common-mode range (CMR), resulting from the scaling of a power supply voltage. That is, when reduction in a power supply voltage, required according to reduction in device dimension, is performed, an input range is significantly reduced unless reducing the threshold voltage. In addition, on the output node, stacked transistors can not be operated in the saturation region due to scaling down of the power supply voltage. In FIG. 1, this problem becomes significant when the current source 101 is implemented by a MOSFET (Metal Oxide Semiconductor Field Effect Transistor).

This contradiction in the design appears especially in a low power system. That is, for the integrated circuit with low power consumption, the threshold voltage is designed to be high in order to prevent a leakage current in the digital circuit part. For integrating an analog circuit part together with such an integrated circuit, some remedies are needed.

One of the solutions to this problem is to introduce transistors with a high breakdown voltage prepared for input and output circuits in addition to the digital circuit core. However, since it is difficult to shorten the gate length of transistors with high breakdown voltage due to its thick gate oxide film, the cutoff frequency of the transistors decreases.

A method to reduce the threshold voltage only in the analog part can also be considered, but this method requires more process steps. This problem becomes especially serious in a fin type FET which is expected to be useful when the bulk planar MOSFET becomes difficult to be scaled down. In other words, in order to change the threshold voltage in the fin type FET, changing a work function of the gate is required, thus considerable increase in the process cost for changing the work function on the same substrate is expected.

In addition, even if the problem concerning with the threshold voltage is solved, another problem concerning with the reduction in signal amplitude on the output remains unsolved. In order to solve this problem, some new ideas must be introduced into the circuit configuration.

As a method to solve this problem, Non-Patent Document 1 proposes a method for utilizing a body bias in the bulk planar MOSFET, i.e., a method for reducing the threshold voltage by utilizing the body bias effect.

Non-Patent Document 1 discloses following two methods.

The first method is to effectively reduce the threshold voltage by applying a forward bias $V_{refo}$ to the bulk terminal of the differential pair of the input transistors in the differential amplifier as shown in FIG. 2. Furthermore, to keep output voltage amplitude, no stacked transistor is used. However, since a large forward bias can not be applied as a body bias in a bulk planar MOSFET, an input voltage range is limited.

The second method disclosed in Non-Patent Document 1 is to detect the common-mode output signal as shown in FIG. 3, and to apply this common-mode component to the gates of the differential pair of the input transistors similarly to a body bias. Also in this method, a range of the feedback voltage is limited.

Non-Patent Document 1: IEEE Journal of Solid-State Circuits, Vol. 40, No. 12, pp. 2373-2387, December 2005.

DISCLOSURE OF INVENTION

Problems to be Solved by the Invention

Therefore, the problem to be solved by the present invention is to make available a bias voltage for adjusting the threshold voltage over a wide range, thereby extending a range of the input voltage amplitude of the semiconductor differential amplifier from a power supply potential to the ground potential. Furthermore, the subject includes providing a circuit which automatically ensures the operation in the saturation region of the differential pair as rejecting the common-mode signal in the entire range of the input voltage.

Solution to Problems

The above problem can be solved by following means.

(1) A semiconductor differential amplifier characterized in that respective first gates of two four-terminal fin type FETs configuring a main body of the differential pair are input terminals of the differential pair, and respective second gates of the two four-terminal fin type FETs are connected with each other to which a signal decreasing monotonically for the common-mode component of the input signals is input.

(2) A semiconductor differential amplifier comprising first and second four-terminal fin type FETs with a same conductivity type configuring a main body of the differential pair, and third and fourth four-terminal fin type FETs with a same conductivity type having characteristics same as those of the first and second four-terminal fin type FETs, and an input signal pair as same as the input signal of the first and second four-terminal fin type FETs being input, characterized in that respective drain terminals and respective second gates of the third and fourth four-terminal fin type FETs are connected commonly to a current source, as well as connected to both of the second gates of the first and second four-terminal fin type FETs.

(3) The semiconductor differential amplifier in accordance with (2), characterized in that first and second current source loads respectively connected to the first and second four-terminal fin type FETs of the main body of the differential pair are configured by fifth and sixth three-terminal fin type FETs having a conductivity type different from that of the first to fourth four-terminal fin type FETs, and a voltage proportional to the common-mode component of the output signals from the first and second four-terminal fin type FETs of the differential pair is input into the gates of the fifth and sixth three-terminal fin type FETs.

Effectiveness of the Invention

By using this semiconductor differential amplifier, an differential input in a entire range from a power supply potential to the ground potential becomes acceptable. Even if a common-mode input level nearly equal to 0V, where the devices are turned to the off state, is input, the input common-mode signal detection circuit operates properly to turn the input transistor of the differential pair to the on state, and by modulating the on state with a differential input applied to the first gates, the differential pair can be operated normally.

Furthermore, since in the input transistor of the differential pair, an effect to reject the common-mode component and to maintain an output common-mode level can be obtained, as automatically adjusting the threshold voltage. Accordingly, tail current source, often used as a general differential pair becomes unnecessary, and number of stacked transistors can be reduced. As a result, the output amplitude can be maximized.

Furthermore, by designing the main body of the differential pair and the input common-mode signal detection circuit especially in accordance with the embodiments disclosed in the present description, each of the transistors in the differential pair can be operated in the saturation region, so that the differential pair realizes a high gain operation in any time.

In addition, even when the rejection of the common-mode component is not capable in the input transistors of the differential pair, the effect of the common-mode feedback performed in the current source load enables to reject the common-mode component and to suppress variation of the output common-mode level. In other words, an operation of the differential amplification can be realized more reliably.

The above circuit functions enable to ensure the input common-mode range and to maximize the output signal amplitude, both of which are necessary at the same time when the threshold voltage can not be scaled in accordance with the scaling of the power supply voltage. In addition, the circuit function is also effective when extremely decreasing the power supply voltage.

Furthermore, the above circuit functions can be realized with the four-terminal fin type FET, a fin type FET device of which two gates are separated. Therefore, in an integrated circuit using the four-terminal fin type FET enables to realize integration of a low power consumption digital circuit along with an analog circuit on the same substrate at low cost by utilizing the present invention.

BEST MODE FOR CARRYING OUT THE INVENTION

The semiconductor differential amplifier in accordance with the present invention will be described in details by referring to the following embodiments.

First Embodiment

Figure 1:
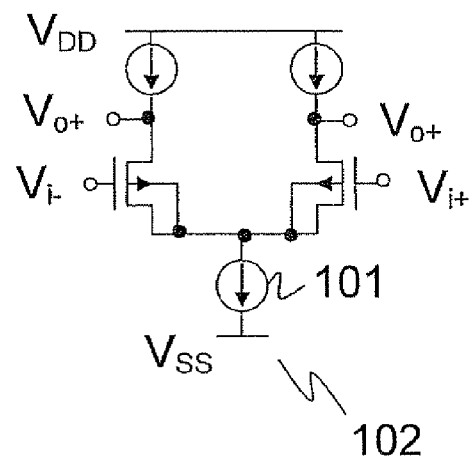
FIG. 1 shows a configuration of the conventional semiconductor differential amplifier.
Figure 2:
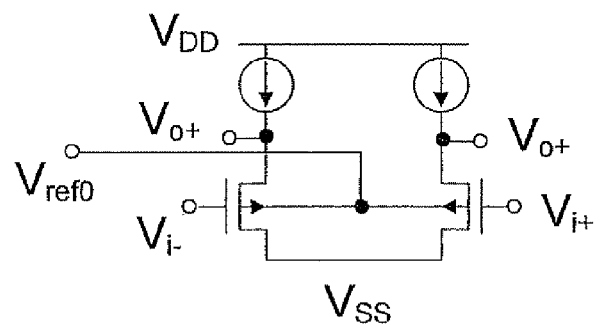
FIG. 2 shows a first semiconductor differential amplifier disclosed in Non-Patent Document 1.
Figure 3:
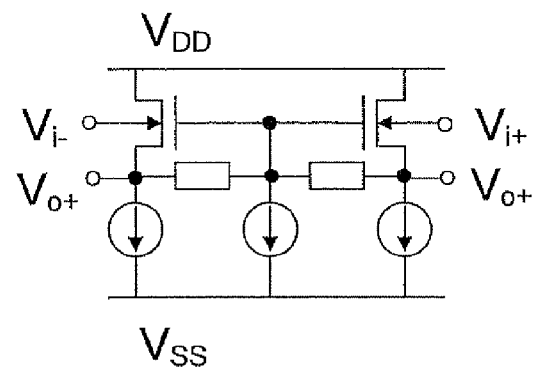
FIG. 3 shows a second semiconductor differential amplifier disclosed in Non-Patent Document 1.
Figure 4:
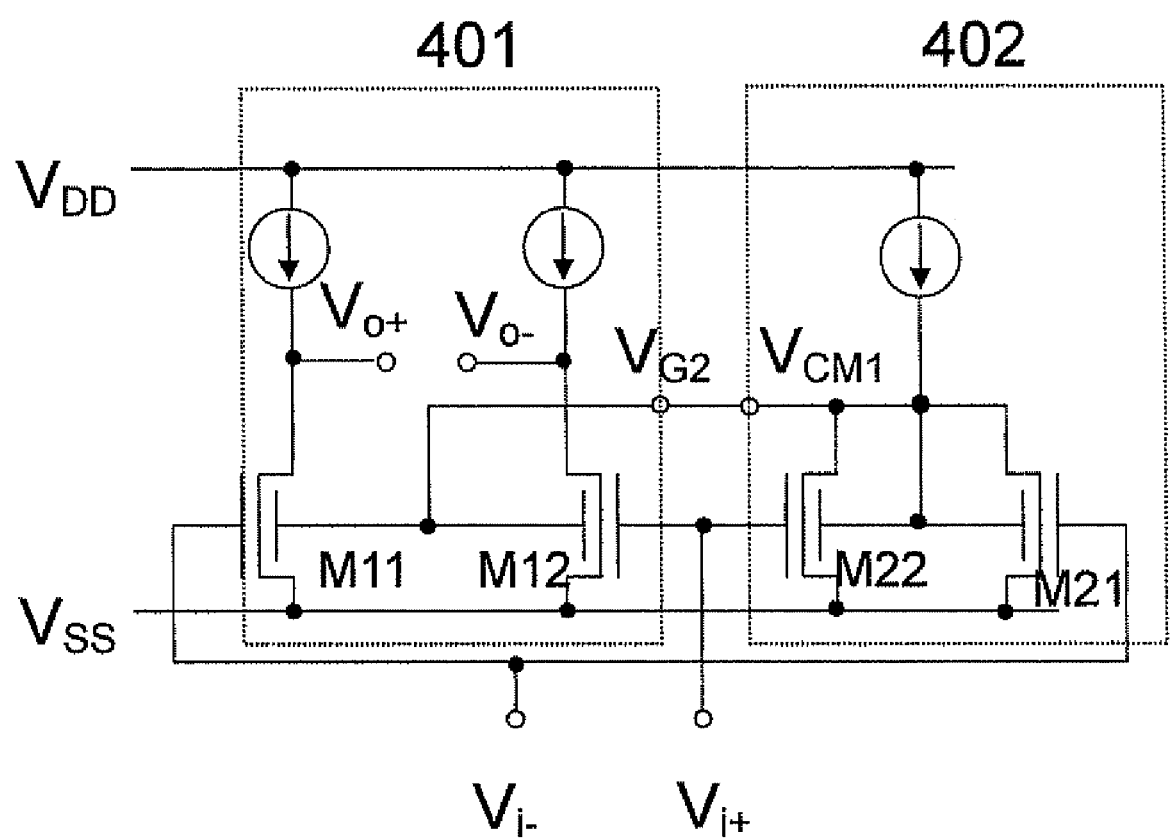
FIG. 4 shows the most fundamental semiconductor differential amplifier in accordance with the present invention.

FIG. 4 shows the most fundamental circuit configuration disclosed in the present invention. In FIG. 4, numeral reference 401 denotes a main body of a differential pair, and 402 denotes an input common-mode component detection circuit. The most fundamental semiconductor differential amplifier is configured by inputting an output voltage $V_{CM1}$ of the input common-mode signal detection circuit to a terminal $V_{G2}$ of the differential pair 401.

Figure 5:
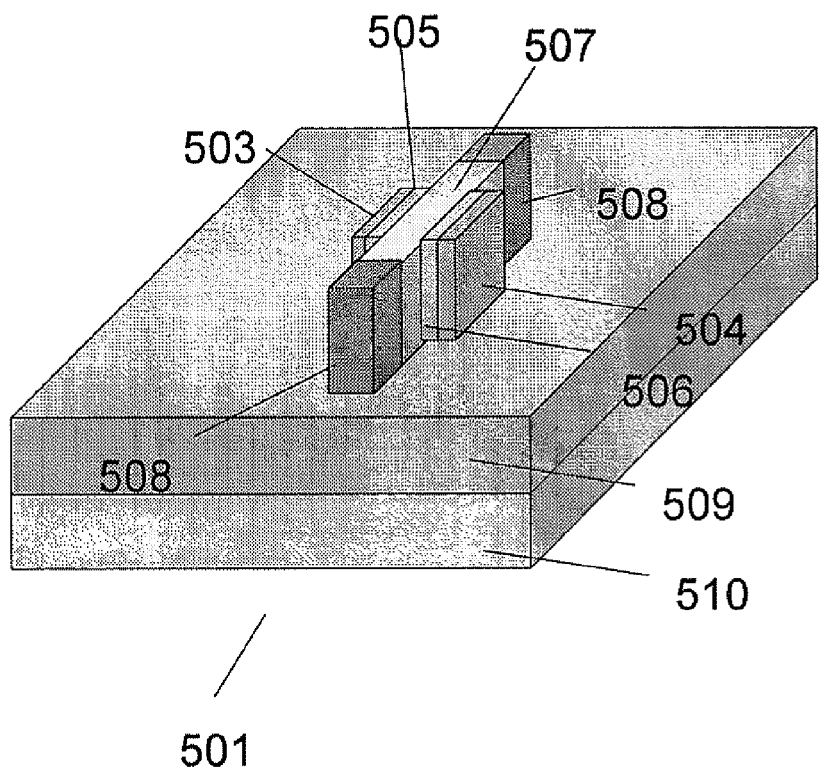
FIG. 5 is a schematic diagram of a four-terminal fin type FET and its symbols used in the present invention.
Figure 5:
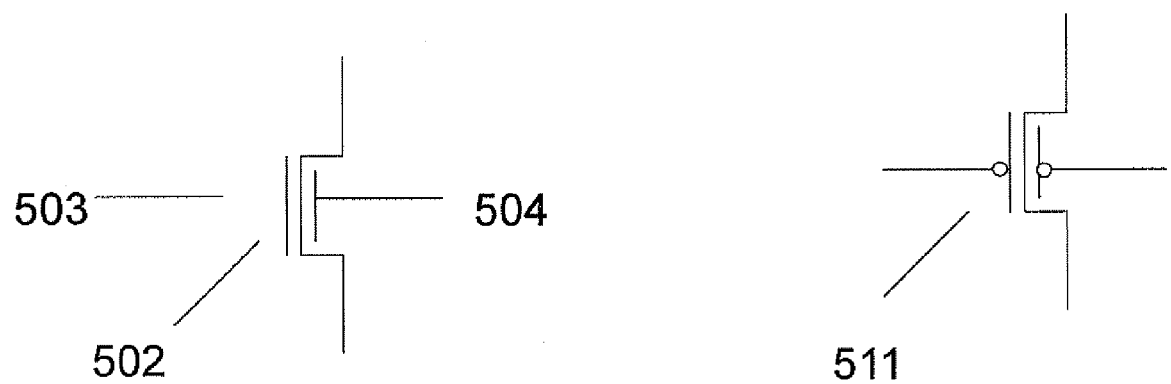

Here, n-channel four-terminal fin type FETs M11, M12, M21, and M22 have a device structure as shown by 501 in FIG. 5. Symbols in a circuit diagram of M11, M12, M21 and M22 are shown by 502. These devices are fabricated by separating the usual connected gates of a typical fin type FET into a first gate 503 and a second gate 504. In this description, an input signal is input into the first gate and a signal for controlling the threshold voltage is input into the second gate.

In FIG. 5, 502 and 511 denote symbols showing an n-channel four-terminal fin type FET and a p-channel four-terminal fin type FET, respectively. Moreover, the four-terminal fin type FET with the first gate and the second gate connected with each other is here referred to as a three-terminal fin type FET.

The input common-mode signal detection circuit 402 decreases an output potential $V_{CM1}$ when an common-mode input signal $V_{CMi}[=(V_{i+}+V_{i-})/2]$ included in an input signal $V_{i+}, V_{i-}$ is large, and increases $V_{CM1}$ when the common-mode input signal is small. That is, $V_{CM1}$ becomes a monotonically decreasing function of $V_{CMi}$.

When $V_{CM1}$ is input into the second gate $V_{G2}$, decrease in the output common-mode signal $V_{CMo}[=(V_{o+}+V_{o-})/2]$ due to an increase in $V_{CMi}$ is suppressed. In other words, the operation to keep $V_{CMo}$ constant can be realized by combining the main body of the differential pair and the input common-mode signal detection circuit.

Second Embodiment

Figure 6:
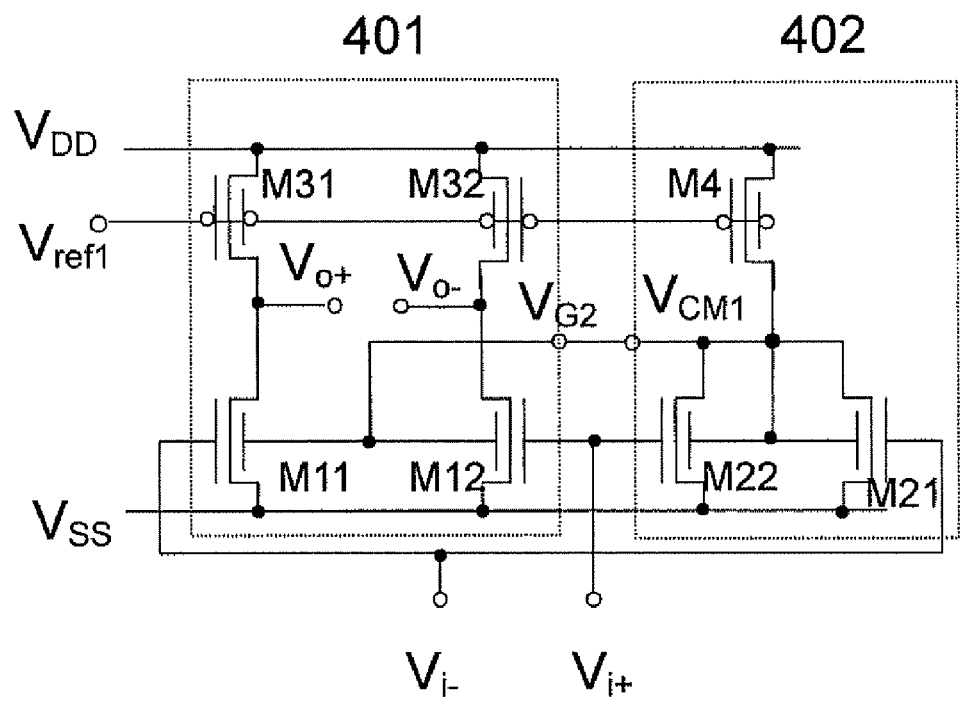
FIG. 6 shows a more realistic version of the semiconductor differential amplifier shown in FIG. 4.

FIG. 6 shows the first embodiment for realizing a current source loads of the input common-mode signal detection circuit 402 and the main body of the differential pair 401 by p-type three-terminal fin type FETs M31, M32 and M4 which are realized by applying a common reference voltage to these p-channel three-terminal fin type FETs in details. However in this embodiment, when an input common-mode signal $V_{CMi}$ becomes too large, $V_{CM1}$ approaches the ground potential, where the operation for common-mode rejection by M11 and M12 becomes impossible, and M11, M12 start to operate in a linear region.

Third Embodiment

Figure 7:
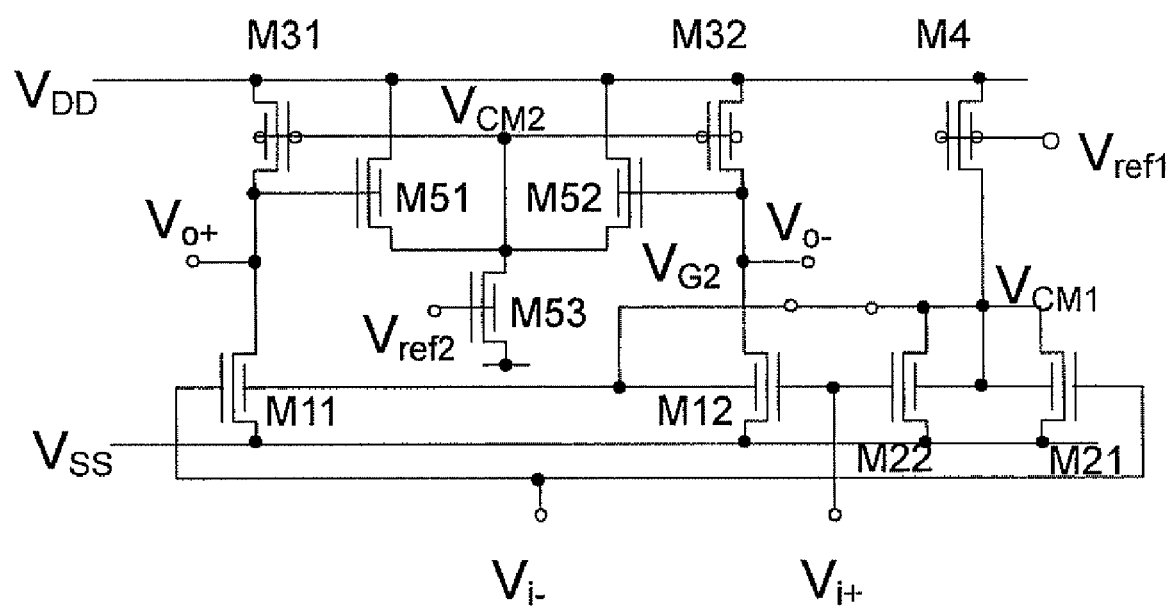
FIG. 7 shows a semiconductor differential amplifier which is the amplifier shown in FIG. 6 with an common-mode feedback mechanism added.

A method to solve this problem is shown in FIG. 7. That is, to gates of p-channel four-terminal fin type FETs M31 and M32, a common-mode feedback signal $V_{cm2}$ generated by n-channel three-terminal fin type FETs M51, M52 and M53 are input. Therefore, even when the common-mode rejection by M11, M12, M21 and M22 can not be performed, an operation in the saturation region is maintained, and the output common-mode level is kept constant in the main body of the differential pair 401.

Fourth Embodiment

Figure 8:
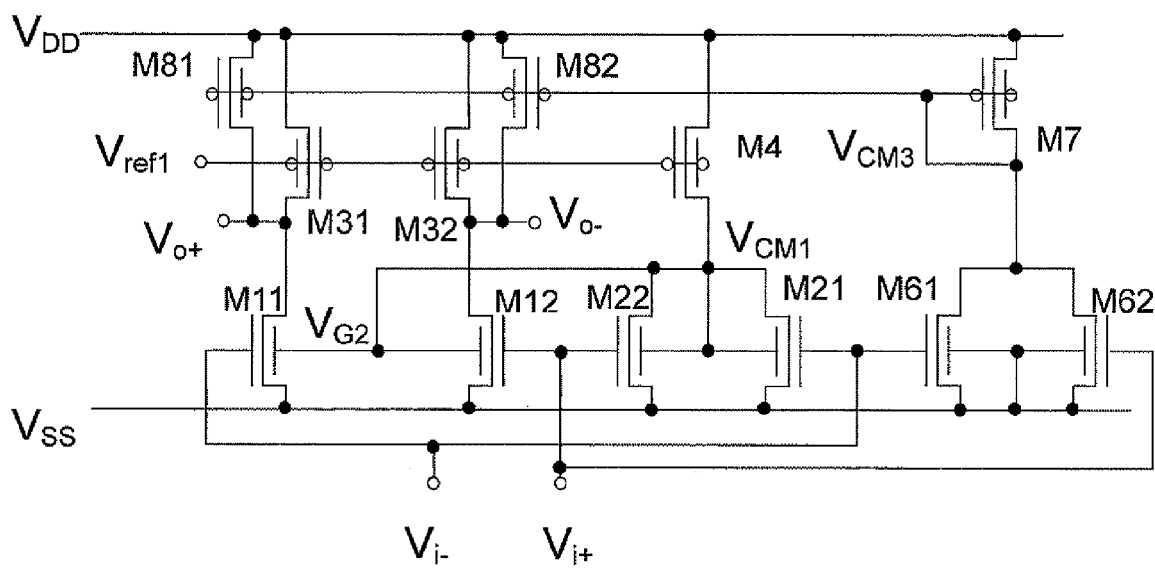
FIG. 8 shows a semiconductor differential amplifier which is the amplifier shown in FIG. 7 but with a modification added by a different method.

Another method to solve the problem in the second embodiment is shown in a circuit configuration illustrated in FIG. 8. In this circuit configuration, a circuit configured by n-channel four-terminal fin type FETs M61 and M62 and p-channel three-terminal fin type FETs M7, M81 and M82, is added. Here, the n-channel four-terminal fin type FETs M21 and M22 and the n-channel four-terminal fin type FETs M61 and M62 are fabricated with the same dimension, and p-channel three-terminal fin-channel FETs M4 and M7 are fabricated with the same dimension. When $V_{CM1}$ output approaches the ground potential, $V_{CM3}$ starts to decrease, and a decreased output common-mode level can be restored.

Furthermore, it is needless to say that if a power supply voltage gives a sufficient headroom in a system for the present invention to be applied to, a gain and an output amplitude can be obtained at the same time by configuring an amplifier with a cascode structure or a folded cascode structure followed by a second stage without stacked transistors.

Example

Figure 9:
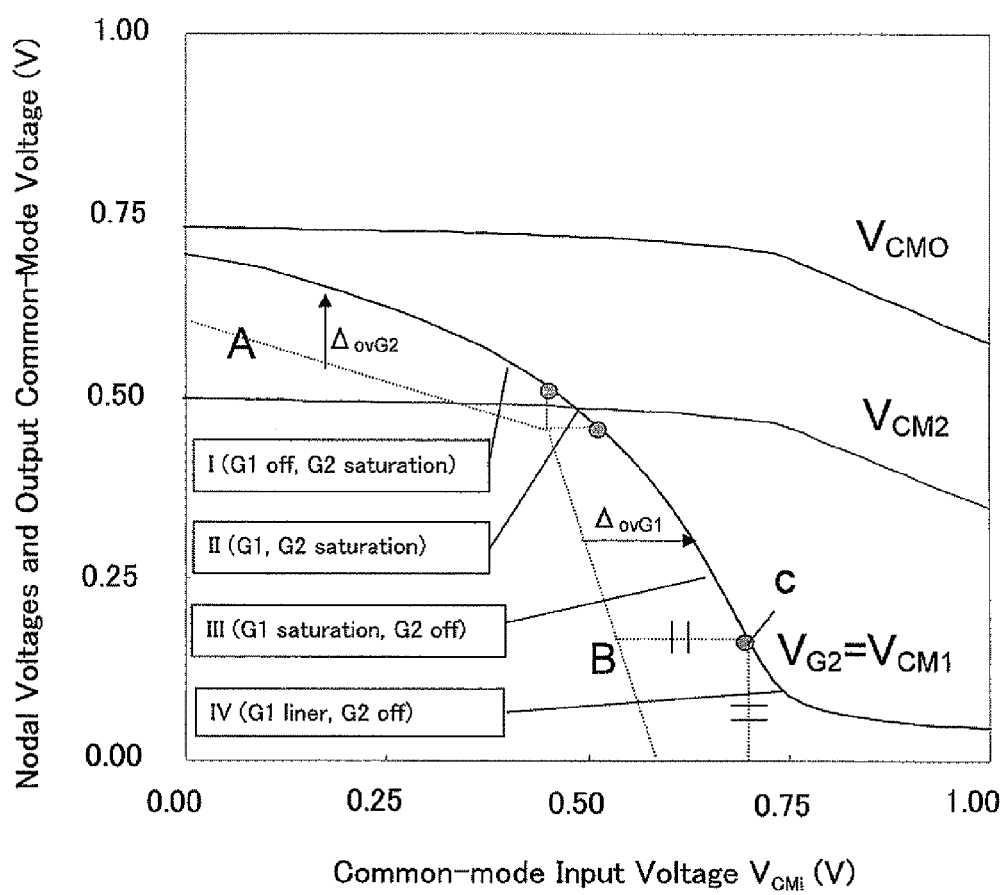
FIG. 9 shows a static characteristic of the common-mode component in an embodiment of the semiconductor differential amplifier shown in FIG. 7.

FIG. 9 shows a static characteristic of voltages at several nodes and output common-mode voltage of practically designed third embodiment.

As for M21 and M22, the first gate G1 and the second gate G2 exist in the operation regions described in FIG. 9 corresponding to the range I to IV on a curve $V_{G2}=V_{CM1}$. A straight line A shows a dependence on the first gate voltage $V_{G1}$ of the threshold voltage $V_{TH,G2}$ of the second gate of M11, M12, M21 and M22, and a straight line B shows a dependence on the first gate voltage $V_{G2}$ of threshold voltage $V_{TH,G2}$ of the first gate of M11, M12, M21 and M22. That is, in the Figure, $\Delta_{OVG2}$ indicates a minimum drain voltage necessary for the second gate to operate in the saturation region, and $\Delta_{OVG1}$ indicates a minimum drain voltage necessary for the first gate to operate in the saturation region. Here, a point c gives $V_{CM1}=\Delta_{OVG1}$, and when $V_{CM1}$ larger than this voltage is input, an inequality $V_{CMi}<\Delta_{OVG1}$ is satisfied. Therefore, when $V_{CMi}$ larger than the point c is input, M21 and M22 enter into a linear operation region.

Since the gate bias conditions of M11, M12 and M21, M22 is the same, if the ratio of W/L of M11 or M12 to M31 or M32 is set to be half of that of M21 or M22 to M4, M11 and M12 are ensured to operate in the saturation region at least in the range I to III. The design example described above, W/L is set according to this condition, and $V_{ref1}=0.5V$ is set by taking account of $V_{th}=0.35V$.

In addition, in the region IV, the common-mode feedback starts to work significantly, so that M11, M12 are ensured to operate in the saturation region. Therefore, the saturation region operation of M11 and M12 is ensured for the entire of $V_{CMi}$ range. As a result, the gain can be increased.

The invention claimed is:

1. A semiconductor differential amplifier comprising first and second four-terminal fin type FETs with a same conductivity type configuring a main body of a differential pair, each of the first and second four-terminal fin type FETs having a first gate receiving an input signal and a second gate, and third and fourth four-terminal fin type FETs with a same conductivity type having characteristics same as those of the first and the second four-terminal fin type FETs, and an input signal as same as the input signal of the first and the second four-terminal fin type FETs being input, wherein respective drain terminals and a respective second gates of the third and fourth four-terminal fin type FETs are connected to a current source commonly, as well as connected to both of the second gates of the first and second four-terminal fin type FETs.

2. The semiconductor differential amplifier in accordance with claim 1, wherein first and second current source loads respectively connected to the first and second four-terminal fin type FETs of the main body of the differential pair are configured by fifth and sixth three-terminal fin type FETs having a conductivity type different from that of the first to fourth four-terminal fin type FETs, and a voltage proportional to a common-mode component of the output signals from the first and second four-terminal fin type FETs of the differential pair is input into the gates of the fifth and sixth three-terminal fin type FETs.

* * * * *